United States Patent
Kost et al.

(10) Patent No.: US 7,436,255 B2
(45) Date of Patent: Oct. 14, 2008

(54) POWER SUPPLY FEED FORWARD ANALOG INPUT FILTER COMPONENT MISMATCH CORRECTION

(75) Inventors: Michael A. Kost, Cedar Park, TX (US); Jack B. Andersen, Cedar Park, TX (US); Daniel L. W. Chieng, Austin, TX (US)

(73) Assignee: D2Audio Corporation, Austin, TX (US)

( * ) Notice: Subject to any disclaimer, the term of this patent is extended or adjusted under 35 U.S.C. 154(b) by 58 days.

(21) Appl. No.: 11/672,321

(22) Filed: Feb. 7, 2007

(65) Prior Publication Data
US 2007/0194845 A1 Aug. 23, 2007

Related U.S. Application Data

(60) Provisional application No. 60/771,212, filed on Feb. 7, 2006.

(51) Int. Cl.
*H03F 3/38* (2006.01)
(52) U.S. Cl. .................. 330/10; 330/251; 330/207 A
(58) Field of Classification Search .................. 330/10, 330/251, 207 A
See application file for complete search history.

(56) References Cited

U.S. PATENT DOCUMENTS

| | | | | |
|---|---|---|---|---|
| 5,559,467 A | * | 9/1996 | Smedley | 330/10 |
| 6,518,838 B1 | * | 2/2003 | Risbo | 330/10 |
| 7,078,964 B2 | * | 7/2006 | Risbo et al. | 330/10 |
| 7,109,789 B2 | * | 9/2006 | Spencer | 330/10 |
| 2004/0028242 A1 | * | 2/2004 | Kitamura | 381/96 |
| 2007/0183490 A1 | * | 8/2007 | Andersen et al. | 375/238 |

* cited by examiner

*Primary Examiner*—Patricia Nguyen
(74) *Attorney, Agent, or Firm*—Law Offices of Mark L. Berrier

(57) ABSTRACT

Systems and methods for minimizing errors due to component variation in switching amplifiers utilizing power supply feed forward techniques. One embodiment comprises a digital PWM amplifier having an amplification subsystem for receiving a digital audio signal and producing an analog output signal. The amplifier includes a power supply feed-forward path configured to modify the digital audio signal based on a power supply measurement. The feed-forward path includes an analog filter configured to filter the power supply measurement, as well as correction circuitry configured to correct component mismatch errors introduced by the filter. The power supply measurement may be a power supply difference, a power supply common mode, or both. In either case, the power supply measurement is corrected by multiplying the measurement by an appropriately scaled power supply difference.

19 Claims, 6 Drawing Sheets

POWER SUPPLY FEED FORWARD ANALOG INPUT FILTER COMPONENT MISMATCH CORRECTION

RELATED APPLICATIONS

This application claims the benefit of U.S. Provisional Patent Application 60/771,212, filed Feb. 7, 2006, which is incorporated by reference as if set forth herein in its entirety. This application is related to U.S. patent application Ser. No. 11/672,331, entitled "Systems and Methods for Correcting Errors Resulting from Component Mismatch in a Feedback Path", by Kost, et al., filed Feb. 7, 2007 which is incorporated by reference as if set forth herein in its entirety.

BACKGROUND

1. Field of the Invention

The invention relates generally to audio amplification systems, and more particularly to systems and methods for minimizing errors due to component variation in switching amplifiers utilizing power supply feed forward techniques.

2. Related Art

Practical audio power amplifiers using Pulse Width Modulation (PWM) have been known since the mid 1960s. In amplifiers from that era, a pulse train was generated by comparing a voltage representing the incoming audio signal with a reference waveform, typically a triangular wave or sawtooth wave, with a frequency in the range 50 kHz-200 kHz. The comparison yielded a 2-level rectangular wave having the same frequency as the reference waveform, and with a mark:space ratio varying in sympathy with the audio. The rectangular wave was amplified to the desired power level and then passively lowpass filtered to remove most of the high-frequency components of the rectangular wave, leaving its average level, which follows the audio, to drive a load such as a loudspeaker.

Amplifiers as described above have sometimes been called 'digital' in the popular press, but we shall describe them as 'analog', because the timings of the edges of the rectangular waves can vary continuously in sympathy with the audio. We shall reserve the word 'digital' for an amplifier in which the edge timings are quantized, so that the edge timings can be represented digitally and the edges can be generated by counting pulses produced by a high-precision, high-frequency clock, such as a crystal oscillator. This principle was proposed by Sandier [6], who also realized that the apparent need for a clock frequency in the gigahertz region could be avoided by the use of oversampling and noise shaping. Several commercial products are now available that use this principle (see for example [3].)

As conventional open-loop digital amplifiers have very little power supply rejection, they require high precision DC power sources to provide high fidelity audio. The construction of these power sources requires large and expensive capacitors and inductors to provide the high precision DC power sources. Smedley, "Digital, pulse width modulation audio power amplifier with noise and ripple shaping," U.S. Pat. No. 5,559,467 (1995) illustrates how to correct for the power supply line ripple. Others, like Andersen et al, "Delta-sigma amplifiers with output stage supply voltage variation and compensations and methods and digital amplifier systems using the same," U.S. Pat. No. 6,953,620 (2004) illustrate how to correct for power supply common mode imperfections.

Both of these examples, however are limited in their performance based on the quality of the analog to digital conversion process, and more specifically to the analog filter used on the input to the analog to digital converter (ADC).

SUMMARY OF THE INVENTION

One or more of the problems outlined above may be solved by the various embodiments of the invention. Broadly speaking, the invention comprises systems and methods for minimizing errors due to component variation in switching amplifiers utilizing power supply feed forward techniques.

One embodiment comprises a digital PWM amplifier having an amplification subsystem for receiving a digital audio signal and producing an analog output signal. The amplifier includes a power supply feed-forward path configured to modify the digital audio signal based on a power supply measurement. The feed-forward path includes an analog filter configured to filter the power supply measurement, as well as correction circuitry configured to correct component mismatch errors introduced by the filter.

The power supply measurement may be a power supply difference, a power supply common mode, or both. In either case, the power supply measurement is corrected by multiplying the measurement by an appropriately scaled power supply difference. Analog-to-digital converters (ADC's,) serial interfaces and decimators may be used to digitize the power supply measurements. In one embodiment, the digital audio signal is summed with the negative of a scaled, corrected common mode measurement. The corrected common mode measurement results from summing the common mode measurement with a scaled power supply difference. The digital audio signal is also divided by a scaled power supply difference.

Another embodiment comprises a method implemented in a digital pulse width modulated (PWM) amplifier. The method includes obtaining an analog power supply measurement, filtering the analog power supply measurement to produce a feed-forward signal, and correcting the feed-forward signal by adding a scaled power supply difference to reduce component mismatch errors in the feed-forward signal. The corrected power supply measurement may be a power supply common mode, a power supply difference, or both.

Numerous other embodiments and variations are also possible.

BRIEF DESCRIPTION OF THE DRAWINGS

Other objects and advantages of the invention may become apparent upon reading the following detailed description and upon reference to the accompanying drawings.

Figure 1:
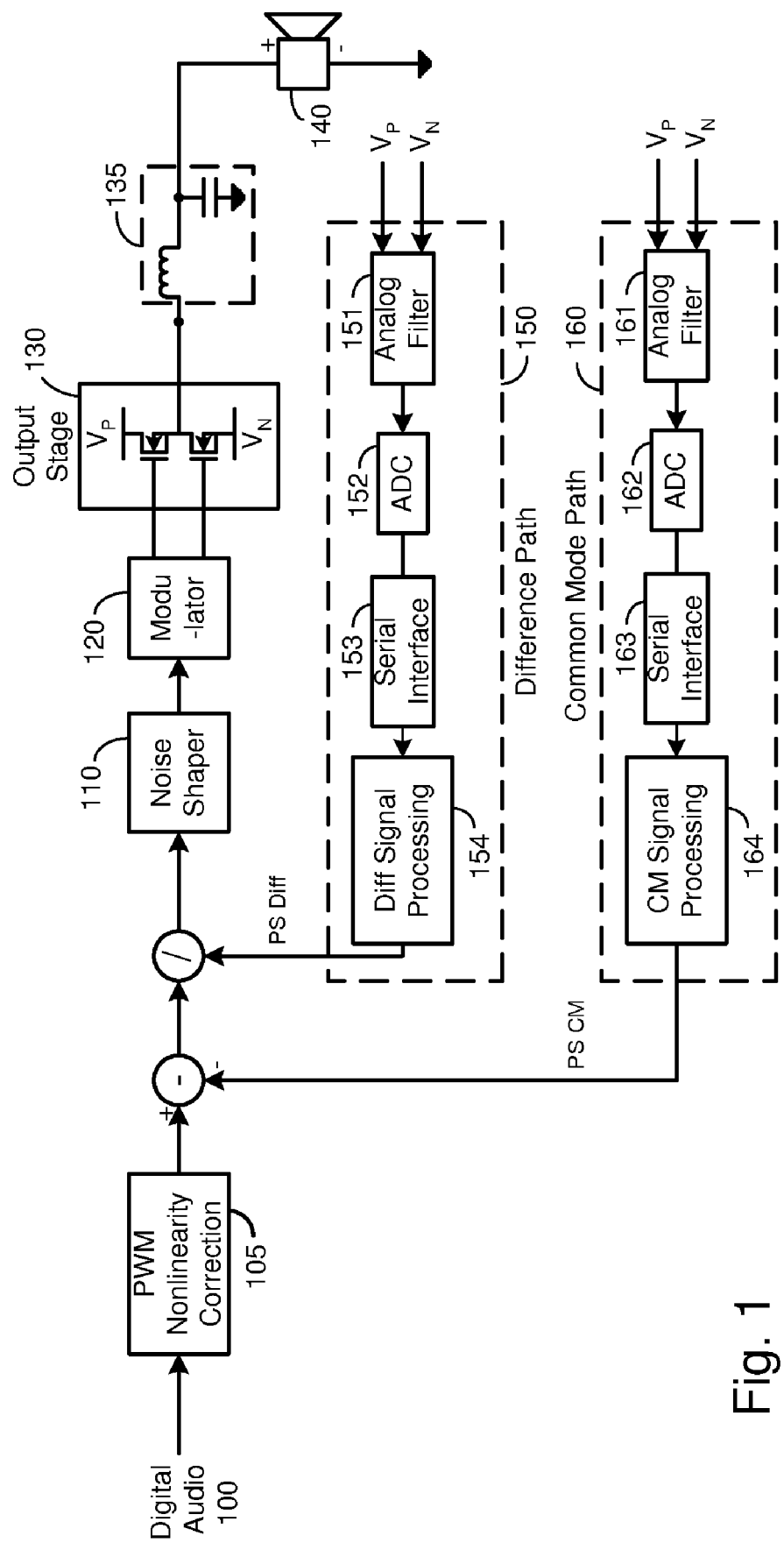
FIG. 1 is a functional block diagram illustrating a digital PWM amplification system utilizing power supply feed forward.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for minimizing errors due to component variation in switching amplifiers utilizing power supply feed forward techniques.

Correcting for power supply variation in switching amplifiers is a subject that is addressed in a number of references. U.S. Pat. No. 5,559,467 first addressed correcting for line ripple by dividing the output signal by a measured power supply amplitude to produce a ripple corrected version. Likewise, U.S. Pat. No. 6,943,620 addressed techniques to correct for the power supply common mode by subtracting a measured power supply common mode to produce a corrected output.

A digital PWM amplifier with power supply feed forward is shown in FIG. 1. As depicted in the figure, the PWM amplifier system comprises a digital audio signal (100), a PWM nonlinearity correction (105), a noise shaper (110), a modulator (120), an output stage (130), an LC low-pass filter (135), a load (140), a difference path (150), and a common mode path (160). The difference path processes a signal corresponding to the difference, or amplitude of the power supply signal, while the common mode path handles a common mode, or offset, signal. The difference path consists of an analog filter (151), an ADC (152), a serial interface block (153), and a difference signal processing block (155). The common mode path (160) consists of an analog filter (161), an ADC (162), a serial interface block (163), and a difference signal processing block (164).

In normal operation, a digital audio signal (100) is provided to the amplifier. The digital audio signal (100) is typically in a 24-bit, pulse-code modulated (PCM) format and typically supplied at a 512 kHz sampling rate. A PWM nonlinearity correction block (105) applies a pre-correction to the digital audio signal that approximately corrects for the non-linear artifacts created by the PCM to PWM conversion. The pre-corrected digital audio has the common mode path (160) output subtracted from it and is then divided by the difference path (150) output. It is then noise-shaped in the noise shaper (110). The noise shaper typically quantizes the 24-bit PCM digital audio sample to a 10-bit PCM digital audio sample and uses noise shaping techniques to reduce the quantization noise inside the audio band, typically DC to 20 or 40 kHz. The modulator block (120) performs the PCM to PWM conversion on the 10-bit digital audio. 2-level modulation is typically used. The output stage (130) amplifies the PWM waveforms generated by the modulator block (120), typically utilizing high voltage power supplies ($V_P$, $V_N$), high power field-effects transistors (FETs), and various other components. The output stage (130) output is filtered by the passive LC filter (131) to attenuate the PWM switching signal and connected to the load (140), typically a loudspeaker.

In the difference path (150), the positive and negative power supplies ($V_P$, $V_N$ respectively) used in the output stage (130) are filtered by an analog filter (151) and routed to the analog to digital converter (ADC) (152). The filter is typically a difference filter with a $3^{rd}$ order low-pass filter with a DC gain of 0.2 and 2 poles at 100 kHz and 1 pole at 500 kHz. The ADC (152) is typically a multi-bit delta-sigma audio converter and digitizes the analog filtered PWM output. Each delta-sigma word is typically 4 bits long and is serialized by the ADC (152) and transmitted by a serial bus to the serial interface (153), which deserializes the delta-sigma word and presents it to the difference signal processing block (154). The difference signal processing block (154) will typically decimate the incoming delta-sigma modulator word to the PWM sampling rate of 512 kHz and perform any necessary signal processing.

In the common mode path (160), the positive and negative power supplies ($V_P$, $V_N$ respectively) used in the output stage (130) are filtered by an analog filter (161) and routed to the analog to digital converter (ADC) (162). The filter is typically a summation filter with a $3^{rd}$ order low-pass filter with a DC gain of 0.2 and 2 poles at 100 kHz and 1 pole at 500 kHz. The ADC (162) is typically a multi-bit delta-sigma audio converter and digitizes the analog filtered PWM output. Each delta-sigma word is typically 4 bits long and is serialized by the ADC (162) and transmitted by a serial bus to the serial interface (163), which deserializes the delta-sigma word and presents it to the common mode processing signal processing block (164). The common mode signal processing block (164) will typically decimate the incoming delta-sigma modulator word to the PWM sampling rate of 512 kHz and perform any necessary signal processing.

The analog filters are of specific concern in real-world implementations. The overall system performance relies on the quality of the analog filters (151, 161) and ADCs (152, 162) in the feed-forward paths. The analog filter is typically constructed of several discrete passive components such as resistors and capacitors. Consider the difference analog filter topology shown in FIG. 2, which is typically used for measuring the power supply difference. $V_P$ is the positive voltage utilized in the output stage (130) from FIG. 1. $V_N$ is the negative voltage utilized in the output stage (130) from FIG. 1. Various resistors (R0, R1, R2, R3, and R4) and capacitors (C0, C1, and C2) are used in conjunction with an operational amplifier, or op-amp (210). It should be noted that components of the same name are designating components of the same value. Components associated with the negative input of the op-amp (220) are referred to as the inverting components. Components associated with the positive input of the op-amp (23) are referred to as non-inverting components. $V_{REF}$ is the common-mode bias point for the circuit and is typically supplied by the ADC that uses the output $V_{OUT}$. Those skilled in the art will recognize that the output of the illustrated analog filter is single-ended and, if called for by a specific ADC, an inverting stage may be used to construct a differential output.

Figure 3:
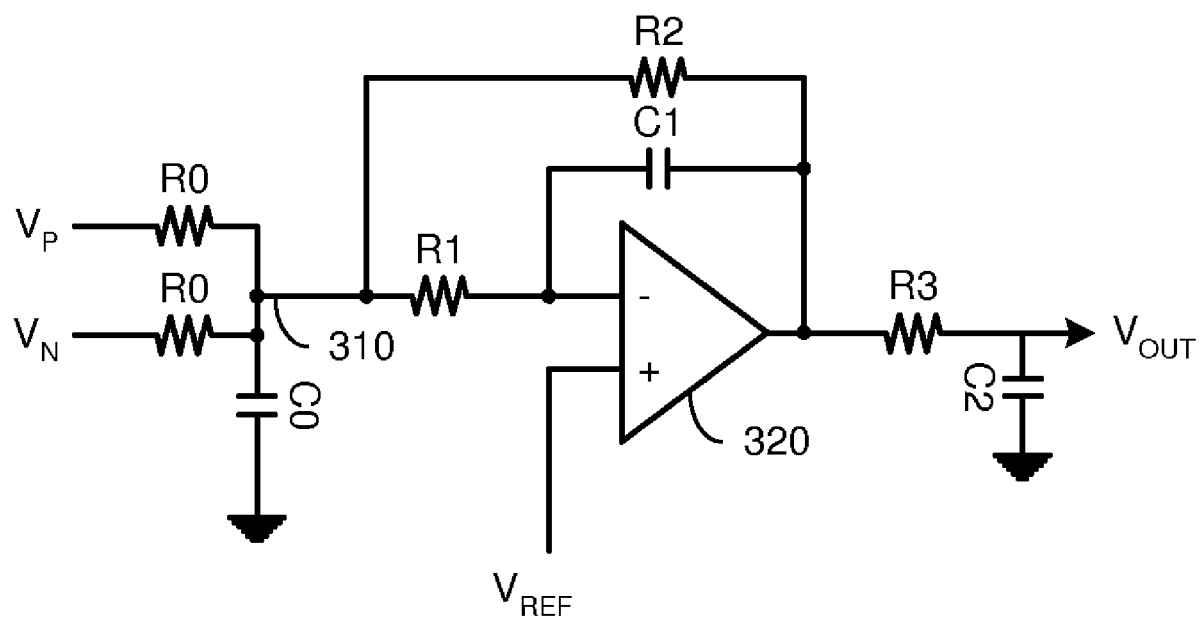
FIG. 3 is a functional block diagram illustrating an analog filter for measuring the power supply common mode.

Likewise, consider the summing amplifier shown in FIG. 3, which is typically used for measuring the power supply common mode. $V_P$ is the positive voltage utilized in the output stage (130) from FIG. 1. $V_N$ is the negative voltage utilized in the output stage (130) from FIG. 1. Various resistors (R0, R1, R2, and R3) and capacitors (C0, C1, and C2) are used in conjunction with an operational amplifier, or op-amp (320). It should be noted that components of the same name are designating components of the same value. $V_{REF}$ is the common-mode bias point for the circuit and is typically supplied by the ADC the uses the output $V_{OUT}$. Those skilled in the art will recognize that the output of the illustrated analog filter is inverted and single-ended and, if called for by a specific ADC, an inverting stage may be used to construct a differential output or non-inverting output.

Figure 2:
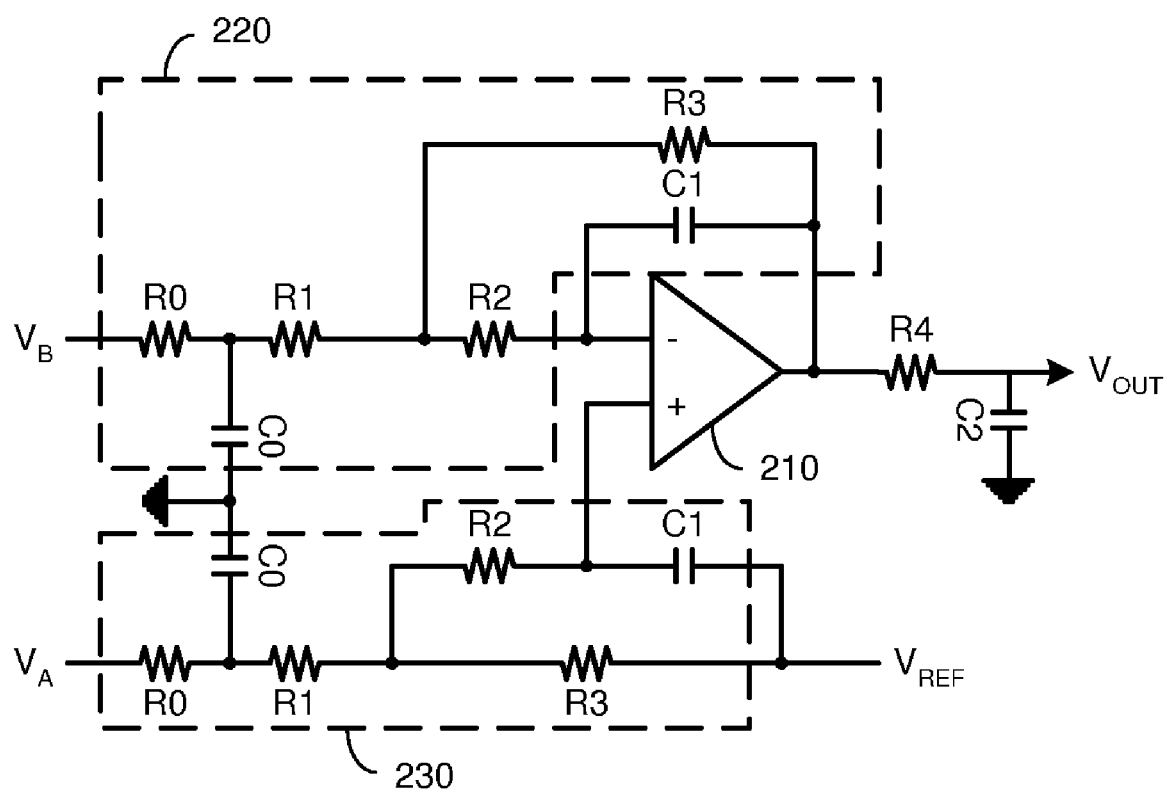
FIG. 2 is a functional block diagram illustrating an analog filter for measuring the power supply difference.

The analog filter in FIG. 2 retains its highest performance if the non-inverting components in the non-inverting path have perfect matching with the same-named inverting components in the inverting path. In the real-world, however, typical resistors match to within 5% and high-quality resistors match to within 1%. Similarly, typical capacitors match to within 20% and high-quality capacitors match to within 5%. Because capacitor matching issues do not have much of an impact at audio frequencies (DC to 20 kHz) relative to resistor matching issues, capacitor mismatch is typically ignored. The result of imperfect matching is that the positive voltage ($V_P$) is not differenced equally with the negative voltage ($V_P$), resulting in imperfect measurements that will couple to the amplifier output because of the power supply feed forward. Likewise, the analog filter in FIG. 3 requires good matching between the two R0 resistors to properly sum $V_P$ and $V_N$ into the summing node (310).

The system performance would improve if it were possible to compensate for the component mismatch. More emphasis is placed on the power supply common mode matching because the power supply common mode correction couples additively with the PWM output. Because of the additive coupling, errors are visible at zero audio signal level. For power supply difference correction, which is multiplicative, the error scales with the audio signal level, allowing some amount of error to be masked by the audio signal.

Figure 4:
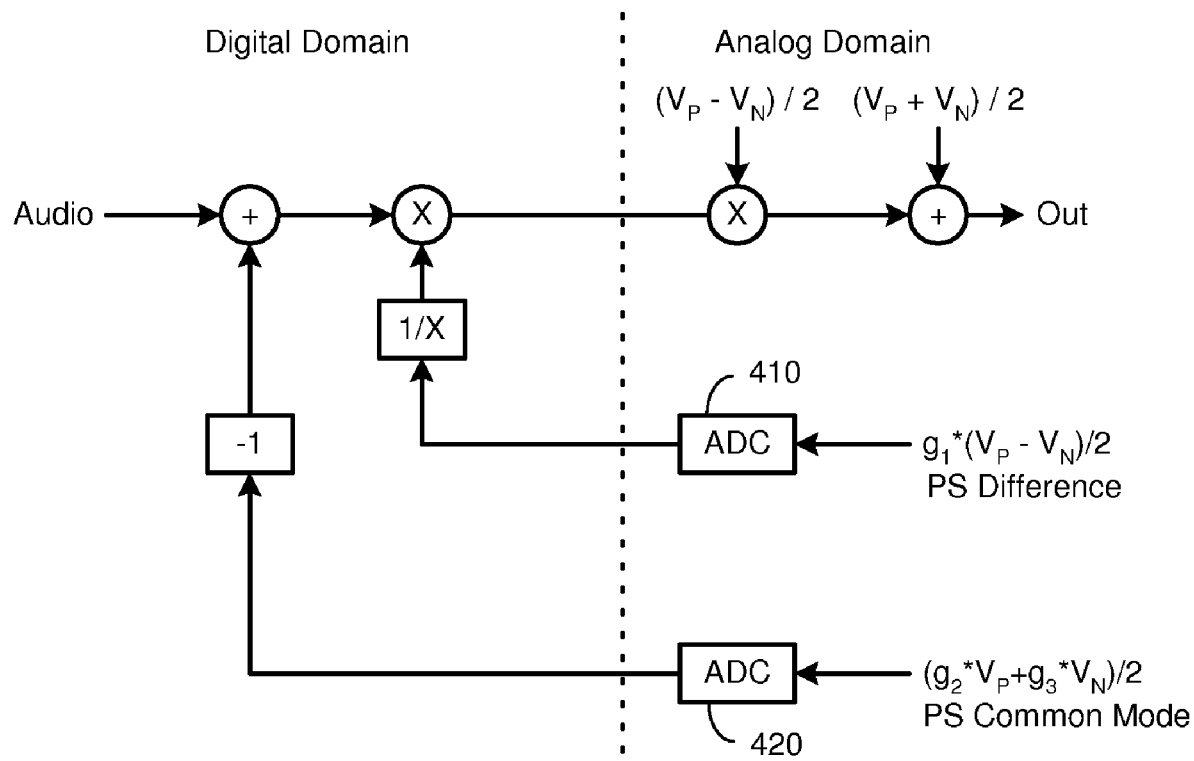
FIG. 4 is a block diagram illustrating a mathematical model of a power supply feed forward system.

FIG. 4 shows a mathematical model that illustrates the problem created by component variations. The model illustrates the audio input being summed with the negative of the power supply common mode feed forward from the power supply common mode ADC (420). The component variation is modeled as the two power supply components being multiplied by independent gains, $(g_2*V_P+g_3*V_N)/2$. The sum of the input audio and the negative common mode feed-forward signal is then multiplied by 1 over the power supply difference (i.e., divided by the power supply difference) from the power supply difference ADC (410). The power supply difference is modeled as the difference scaled by a gain, $g_1*(V_P-V_N)/2$. The resulting signal is then multiplied by the actual power supply difference, $(V_P-V_N)/2$, and has the actual power supply common mode, $(V_P+V_N)/2$, added. The two preceding steps accurately model the high voltage output stage. The result of a properly calibrated system ($g_1=g_2=g_3=1$) is for the signals Out and Audio to be equal. However, the actual results are illustrated in the following equation.

$$\left(x - \frac{g_2*V_P + g_3*V_N}{2}\right) * \frac{V_P - V_N}{g_1*(V_P - V_N)} + \frac{V_P + V_N}{2}$$

Figure 5:
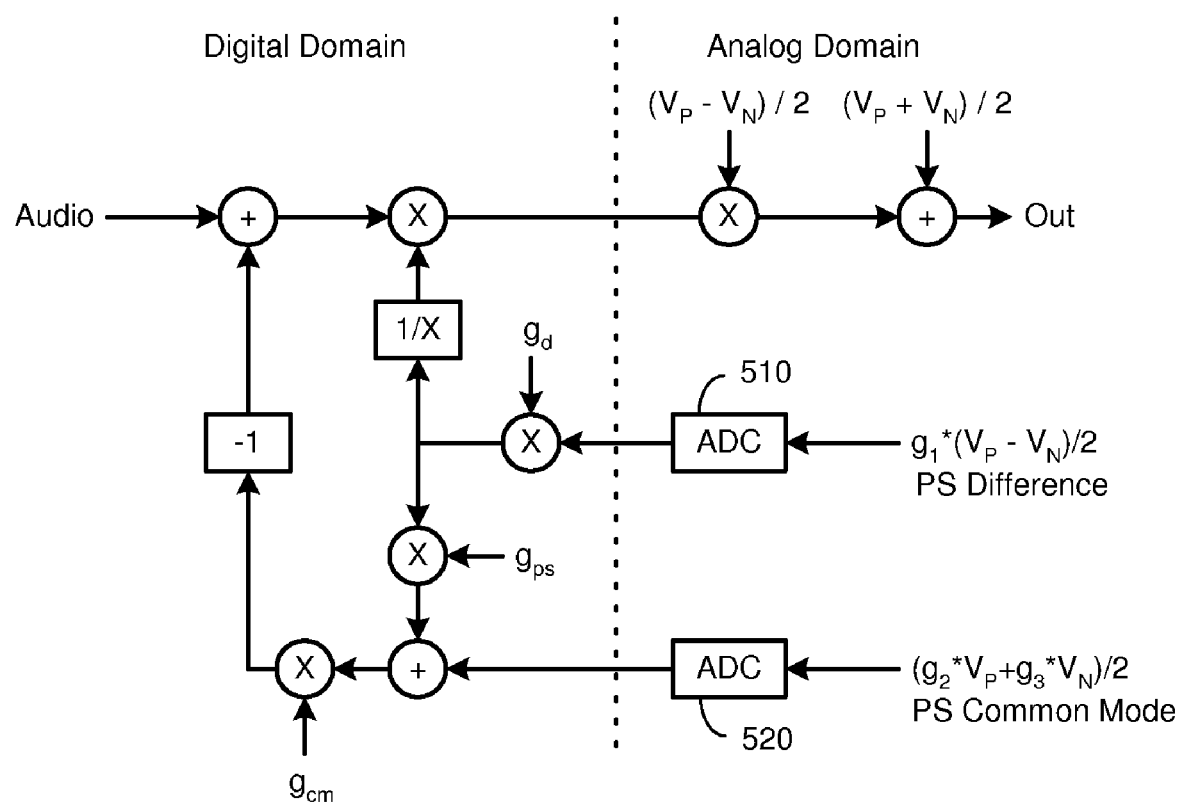
FIG. 5 is a block diagram illustrating a mathematical model of an improved power supply feed forward system.

To improve the amplifier output, it is necessary to introduce 3 correction gains, $g_d$, $g_{ps}$, and $g_{cm}$, as illustrated in FIG. 5. In this model, the power supply difference is again modeled as half the difference of the two power supply components scaled by a gain, $g1*(VP-VN)/2$. The common mode is modeled as half the sum of the two power supply components, each scaled by a separate gain, $(g2*VP+g3*VN)/2$. The gains are different to model the component variation. The power supply difference from ADC 510 is scaled by a gain, gd, then scaled by a second gain, gps, before being summed with the power supply common mode signal from ADC 520. The sum is multiplied by a third gain, gcm, and inverted before being summed with the input audio. The resulting audio signal is multiplied by 1 over the gd-scaled power supply difference output from ADC 510. The resulting signal is multiplied by the actual power supply difference, (VP−VN)/2, and then has the actual power supply common mode, (VP+VN)/2, added to it. If the proper values are selected for $g_d$, $g_{ps}$, and $g_{cm}$ as shown below, the component-variation-induced errors will be corrected.

$$g_d = \frac{1}{g_1}$$

$$g_{cm} = \frac{g_2 + g_3}{2}$$

$$g_{ps} = \frac{g_3 - g_2}{2}$$

Calculating $g_d$, $g_{cm}$, and $g_{ps}$ from component values may not always be practical. Individual resistors may be difficult to measure in-system. Instead, they may be determined empirically to gain a reasonable improvement in system performance. The $g_d$ gain can be established by comparing the amplifier gain with the power supply feed-forward enabled, versus the amplifier gain with the power supply feed-forward disabled, for a nominal power supply. This is easily accomplished by playing a high amplitude tone at, for example, −10 dbFS (10 dB below full scale.) An analog measurement tool is used to compare the output amplitudes, and $g_d$ is varied until the output amplitudes with the power supply feed-forward enabled and disabled are approximately equal. To determine the value of $g_{ps}$ and $g_{cm}$, an analog measurement tool capable of measuring total harmonic distortion plus noise (THD+N) is used. Silence is played into the amplifier with both the common mode and difference feed-forward enabled, and $g_{ps}$ and $g_{cm}$ are varied to minimize the measured THD+N value. The $g_{ps}$ value will start at approximately 0.0 and $g_{cm}$ will start at approximately 1.0.

Figure 6:
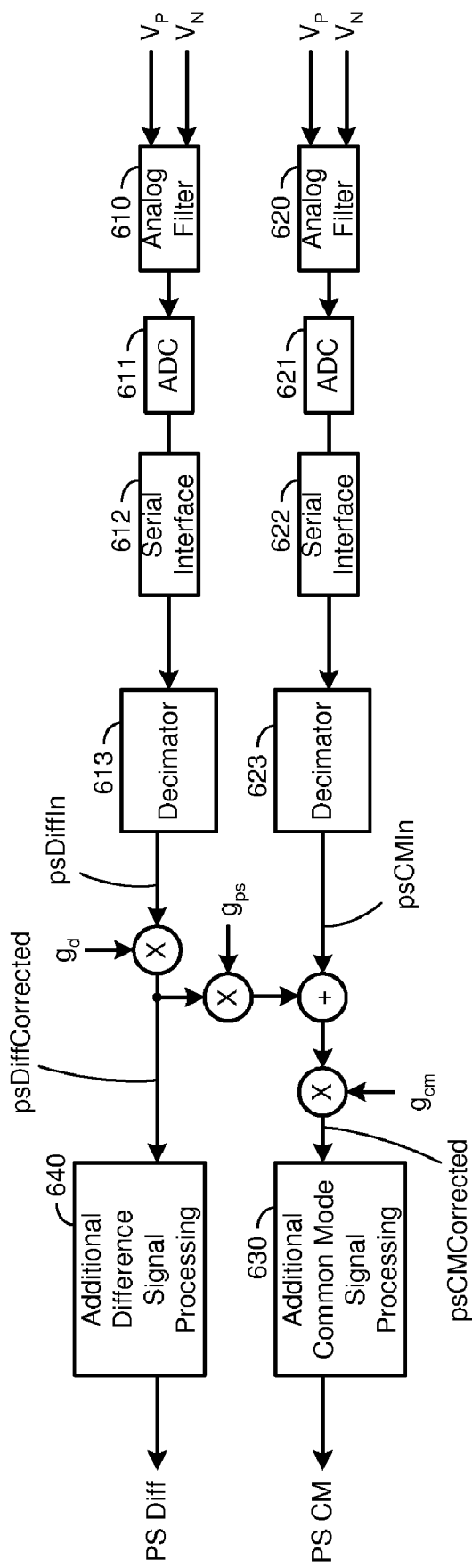
FIG. 6 is a functional block diagram illustrating an improved digital PWM amplification system utilizing power supply feed forward.

FIG. 6 is a functional block diagram illustrating the power supply feed-forward correction, as it could be used in a typical application. The analog filter (610), ADC (611) and serial interface (612) correspond to elements in FIG. 1, namely the difference path (150) analog filter (151), ADC (152), and serial interface (153). The analog filter (620), ADC (621) and serial interface (622) correspond to elements in FIG. 1, namely the common mode path (160) analog filter (161), ADC (162), and serial interface (163). The decimator (613) and additional difference signal processing (640) blocks are elements found in the Diff signal processing (154) block in FIG. 1. The decimator (623) and additional common mode signal processing (630) blocks are elements found in the CM signal processing (164) block in FIG. 1.

The analog filter (610), ADC (611), and serial interface (612) filter and digitize the power supply difference. The ADC outputs delta-sigma words at a typical rate of 6.144 MHz. The decimator (613) performs a 12 to 1 decimation, resulting in an output rate of 512 kHz, to generate the "psDiff" signal. The other analog filter (620), ADC (621), and serial interface (622) filter and digitize the power supply common mode. Again, the ADC outputs delta-sigma words at a typical rate of 6.144 MHz. The decimator (623) performs a 12 to 1 decimation, resulting in an output rate of 512 kHz, to generate the "psCMIn" signal. The disclosed embodiment is used to generate the "psDiffCorrected" and "psCMCorrected" signals using the following algorithms:

*psDiff*Corrected=$g_d$\**psDiffIn*

*psCM*Corrected=$g_{cm}$\*(*pcCMIn*+*psDiff*Corrected\*$g_{ps}$)

Additional signal processing is applied in the additional difference signal processing (640) and additional common mode signal processing (630) blocks. These blocks are typically composed of FIR filters that shape the bandwidth of the power supply difference and power supply common mode correction signals. For example, it may be beneficial to limit the bandwidth of the power supply difference to less than 20 kHz in order to prevent ultrasonic artifacts from modulating into the audio band. The "PS Diff" and "PS CM" signals correspond to the signals of the same name in FIG. 1.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A digital PWM amplifier comprising:
    an amplification subsystem configured to receive a digital audio signal and to produce an analog output signal; and
    a power supply feed-forward path configured to receive a power supply measurement, produce a feed-forward signal, and modify the digital audio signal based on the feed-forward signal;
    wherein the feed-forward path includes an analog filter configured to filter the power supply measurement; and
    wherein the feed-forward path includes correction circuitry configured to correct component mismatch errors introduced by the filter.

2. The digital PWM amplifier of claim 1, wherein the feed-forward path is configured to receive a power supply difference measurement, to produce a power supply feed-forward signal, and to multiply the digital audio signal by the power supply feed-forward signal.

3. The digital PWM amplifier of claim 2, wherein the feed-forward path is configured to multiply the power supply difference measurement by a gain before multiplying the digital audio signal by the power supply feed-forward signal.

4. The digital PWM amplifier of claim 1, wherein the feed-forward path is configured to receive a power supply common mode measurement, to produce a power supply feed-forward signal, and to sum the digital audio signal with the power supply feed-forward signal.

5. The digital PWM amplifier of claim 4, wherein the feed-forward path is configured to multiply the power supply common mode measurement by a gain before summing the digital audio signal with the power supply feed-forward signal.

6. The digital PWM amplifier of claim 1, wherein the feed-forward path comprises a power supply difference path configured to receive a power supply difference measurement and a power supply common mode path configured to receive a power supply common mode measurement.

7. The digital PWM amplifier of claim 6, further comprising a first analog-to-digital converter (ADC) configured to digitize the power supply difference measurement and a second ADC configured to digitize the power supply common mode measurement.

8. The digital PWM amplifier of claim 7, further comprising a first serial interface configured to deserialize an output of the first ADC and a second serial interface configured to deserialize an output of the second ADC.

9. The digital PWM amplifier of claim 8, further comprising a first decimator configured to decimate an output of the first serial interface and a second decimator configured to decimate an output of the second serial interface.

10. The digital PWM amplifier of claim 9, further comprising:
    a first multiplier configured to multiply an output of the first decimator by a first gain to produce a corrected power supply difference signal;
    a second multiplier configured to multiply the corrected power supply difference signal by a second gain;
    an adder configured to sum the output of the second decimator with an output of the second multiplier; and
    a third multiplier configured to multiply the output of the adder by a third gain to produce a corrected power supply common mode signal.

11. The digital PWM amplifier of claim 10, further comprising:
    a difference signal processing unit configured to receive the corrected power supply difference signal and process the corrected power supply difference signal to produce a power supply difference feed-forward signal; and
    a common mode signal processing unit configured to receive the corrected power supply common mode signal and process the corrected power supply common mode signal to produce a power supply common mode feed-forward signal.

12. The digital PWM amplifier of claim 11, wherein the amplification subsystem is configured to
    sum the digital audio signal and the negative of the output of the power supply common mode signal processing unit, and
    multiply the resulting signal by 1 over the output of the power supply difference signal processing unit to produce a corrected digital audio signal.

13. The digital PWM amplifier of claim 12, further comprising one or more PWM modulators configured to generate PWM waveforms based on the digital audio signal.

14. The digital PWM amplifier of claim 13, further comprising one or more output stages coupled to the PWM modulators and configured to generate one or more analog output signals based on the received PWM waveforms.

15. The digital PWM amplifier of claim 14, further comprising applying the analog output signals to a load.

16. A method implemented in a digital pulse width modulated (PWM) amplifier, wherein the amplifier includes a feed-forward path, the method comprising:
    obtaining an analog power supply measurement;
    filtering the analog power supply measurement to produce a feed-forward signal;
    obtaining a power supply difference;
    scaling the power supply difference; and
    multiplying the scaled power supply difference by the feed-forward signal to reduce component mismatch errors in the feed-forward signal.

17. The method of claim 16, wherein the analog power supply measurement comprises the power supply difference, the method further comprising:
    receiving a digital audio signal;
    performing PWM non-linearity correction on the digital audio signal;
    multiplying the digital audio signal by the feed-forward signal;
    quantizing the digital audio signal;
    performing noise shaping on the quantized digital audio signal;
    generating one or more PWM waveforms based on the quantized digital audio signal; and
    generating one or more analog output audio signals based on the PWM waveforms.

18. The method of claim 16, wherein the analog power supply measurement comprises a power supply common mode measurement, the method further comprising:
    receiving a digital audio signal;
    performing PWM non-linearity correction on the digital audio signal;
    summing the feed-forward signal with the feed-forward signal;
    multiplying the digital audio signal by the feed-forward signal;
    quantizing the resulting digital audio signal;
    performing noise shaping on the quantized digital audio signal;
    generating one or more PWM waveforms based on the quantized digital audio signal; and
    generating one or more analog output audio signals based on the PWM waveforms.

19. A method implemented in a digital pulse width modulated (PWM) amplifier, wherein the amplifier includes a first feed-forward path and a second feed-forward path, the method comprising:
    obtaining and filtering an analog power supply difference measurement;
    obtaining and filtering an analog power supply common mode measurement;
    scaling the power supply difference measurement by a first gain to produce a first feed-forward signal;
    scaling the first feed-forward signal by a second gain to produce a first signal, summing the first signal with the power supply common mode measurement to produce a second signal, and scaling the second signal by a third gain to produce a second feed-forward signal;
    summing the negative of the second feed-forward signal with an input digital audio signal to produce a first corrected digital audio signal;
    dividing the first corrected digital audio signal by the first feed-forward signal to produce a second corrected digital audio signal; and
    generating a PWM analog output signal based on the second corrected digital audio signal.

* * * * *